United States Patent
Nagatomo et al.

(10) Patent No.: US 8,228,131 B2
(45) Date of Patent: Jul. 24, 2012

(54) CRYSTAL-OSCILLATOR CIRCUIT

(75) Inventors: Kei Nagatomo, Kyoto (JP); Hisato Takeuchi, Osaka (JP); Shuuji Shibuya, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/005,176

(22) Filed: Jan. 12, 2011

(65) Prior Publication Data
US 2011/0227655 A1    Sep. 22, 2011

(30) Foreign Application Priority Data

Mar. 19, 2010 (JP) ................................. 2010-064903
Dec. 2, 2010 (JP) ................................. 2010-269425

(51) Int. Cl.
*H03B 5/32* (2006.01)
(52) U.S. Cl. .............. 331/158; 331/116 R; 331/116 FE; 331/177 V; 331/176
(58) Field of Classification Search ............ 331/116 FE, 331/158, 116 R, 177 V, 176
See application file for complete search history.

(56) References Cited

U.S. PATENT DOCUMENTS

| | | | |
|---|---|---|---|
| 6,977,840 B2 | 11/1999 | Connell et al. | |
| 6,646,514 B2 | 11/2003 | Sutliff et al. | |
| 7,283,006 B2 * | 10/2007 | Tateyama | 331/116 FE |
| 2006/0071730 A1 | 4/2006 | Nagatomo et al. | |

FOREIGN PATENT DOCUMENTS

| | | |
|---|---|---|
| JP | 4167255 | 8/2008 |
| JP | 2008-271355 | 11/2008 |

* cited by examiner

*Primary Examiner* — Arnold Kinkead
(74) *Attorney, Agent, or Firm* — McDermott Will & Emery LLP

(57) ABSTRACT

In a crystal-oscillator circuit having a quartz crystal unit, further stabilization of output frequency change at a time of startup of the power supply is achieved. A crystal-oscillator circuit having a quartz crystal unit includes a first variable-capacitance element, which forms an oscillation loop with the quartz crystal unit, and a temperature compensation circuit which provides a first control signal for the first variable-capacitance element to compensate for a temperature characteristic of the quartz crystal unit. In addition, the crystal-oscillator circuit includes a second variable-capacitance element group, and a time constant circuit which provides a time constant signal, which changes with a predetermined time constant, for the second variable-capacitance element group as a second control signal.

8 Claims, 8 Drawing Sheets

51 Oscillator Circuit Section ns claimspriorityto Japanese PatentAppli-
CRYSTAL-OSCILLATOR CIRCUIT

CROSS-REFERENCE TO RELATED APPLICATION

This application claims priority to Japanese Patent Application No. 2010-064903 filed on Mar. 19, 2010 and Japanese Patent Application No. 2010-269425 filed on Dec. 2, 2010, the disclosure of which including the specification, the drawings, and the claims is hereby incorporated by reference in its entirety.

BACKGROUND

The present disclosure relates to crystal-oscillator circuits having quartz crystal units, and more particularly to stabilization control of the oscillation frequencies.

Crystal-oscillator circuits having quartz crystal units are widely used as oscillator circuits which generate reference frequencies in electronic devices.

In recent years, the transmission data rates in electronic devices have been increased. Such electronic devices perform operations intermittently for the purpose of lowering the power consumptions. In addition, electronic devices are required to have not only a smaller size and a lower weight, but also high reliability and high accuracy. Given such a background, a need exists for a crystal-oscillator circuit to start in a short period of time, and to output a stable oscillation frequency with low power consumption; among others, an oscillation frequency is required to be highly stable against a change in the ambient temperature.

FIG. 6 is a diagram illustrating an example configuration of a conventional crystal-oscillator circuit. In the configuration of FIG. 6, a quartz crystal unit 65 and a MOS variable-capacitance element 60 and a fixed-capacitance element 62 in an oscillator circuit section 51 form an oscillation loop. A component 64 is an inverter, and a component 66 is a resistor. When a supply voltage 67 is applied, a regulated-voltage circuit 52 supplies a predetermined supply voltage to the oscillator circuit section 51, making an impact on the quartz crystal unit 65, thus oscillation starts. An oscillation signal is output from an output circuit 74. A voltage control circuit 73 applies a control voltage to the drain of the MOS variable-capacitance element 60 through a resistor 69 to change the MOS capacitance value. This causes the load capacitance CL of the oscillator circuit section 51 to be changed, and thus an output frequency of the crystal-oscillator circuit is adjusted to a preferable frequency f0.

A quartz crystal unit generally exhibits a temperature characteristic approximated by a cubic function. Accordingly, it is preferable that a function to compensate for the temperature characteristic of a quartz crystal unit be added to a crystal-oscillator circuit. For example, a technique is known in which a control voltage Vc having a temperature characteristic for compensating for the temperature characteristic of a quartz crystal unit is applied to a variable-capacitance element, which serves as a frequency adjustment element, to stabilize the temperature characteristic of the oscillation frequency. However, since generation of an ideal control voltage Vc is technically difficult, temperature compensation of the oscillation frequency is performed generally by generating a control voltage having a temperature characteristic of a quasi-cubic function in various ways. In the configuration of FIG. 6, a temperature compensation circuit 53 applies a control voltage for compensating for the temperature characteristic of the quartz crystal unit 65 to the gate of the MOS variable-capacitance element 60 through a resistor 68.

Next, a module configuration of the crystal-oscillator circuit will be described. The quartz crystal unit and an integrated circuit (IC) chip are packaged in a module by ceramic material. The quartz crystal unit and the IC chip are electrically connected through a gold wiring pattern and gold bumps in the module. The quartz crystal unit and the IC chip are thermally connected through the ceramic material, the gold wiring pattern, and the gold bumps.

In recent years, it is desired that a crystal-oscillator circuit have an excellent startup characteristic of frequency and excellent stability of frequency. In order to provide a high value-added crystal-oscillator circuit, improvement of these characteristics is essential. Japanese Patent No. 4167255 discloses an example of conventional crystal-oscillator circuit.

SUMMARY

In a crystal-oscillator circuit as shown in FIG. 6, the power consumed by the oscillator circuit by turning on a power supply causes the oscillator circuit to generate heat over time. The heat generation of the oscillator circuit causes the operation temperatures of the oscillator circuit and the temperature compensation circuit to change over time, and also the operation temperature of the quartz crystal unit, subjected to the heat generated in the oscillator circuit, to change over time. Accordingly, due to the heat generation of the oscillator circuit, the output frequency changes during a time period after the power supply is turned on and before the module temperature of the crystal-oscillator circuit reaches a steady state. As such, as shown in FIG. 7, a stable startup characteristic of frequency cannot be obtained.

Moreover, conventional temperature compensation is performed only during a time period during which the module temperature of the crystal-oscillator circuit is in a steady state, and is not performed during a time period after the power supply is turned on and before the module temperature of the crystal-oscillator circuit reaches a steady state.

In addition, due to a parasitic element formed by a device layout and/or a wiring layout in the IC, the output frequency changes during a time period after startup of the power supply and before stabilization of the frequency. Even though such a change in the output frequency can be improved to some extent by efforts on improvement of layouts and/or circuits, it is becoming increasingly difficult to provide a sufficient improvement for a crystal-oscillator circuit which is required to have higher accuracy in recent years.

Thus, various frequency changes are combined, including a change in the output frequency of the oscillator circuit due to heat generation, a change in the output frequency of the quartz crystal unit due to heat transfer, a change in the output frequency due to an error of temperature compensation, and a change in the output frequency due to a parasitic element; thus, a change in the output frequency at a time of startup of the power supply is very complex. Also, since the causes of the changes in the output frequency are difficult to be individually identified, reduction of each change in the output frequency is extraordinarily difficult in a crystal-oscillator circuit which is required to have higher accuracy in recent years.

In view of the foregoing, it is an object of the present invention to further stabilize a change in the output frequency at a time of startup of the power supply in a crystal-oscillator circuit having a quartz crystal unit.

In one embodiment of the present invention, a crystal-oscillator circuit includes a quartz crystal unit, a first variable-capacitance element, connected to the quartz crystal unit so as to form an oscillation loop, and whose capacitance value changes depending on a first control signal, a temperature compensation circuit configured to provide the first control signal for the first variable-capacitance element to compensate for a temperature characteristic of the quartz crystal unit, a second variable-capacitance element group, connected to the quartz crystal unit, and whose capacitance value changes depending on a second control signal, and a time constant circuit configured to generate a time constant signal which changes with a predetermined time constant, and to provide the time constant signal for the second variable-capacitance element group as the second control signal.

According to this embodiment, by providing a second variable-capacitance element group, and a time constant circuit configured to generate a time constant signal which changes with a predetermined time constant, and to provide the time constant signal for the second variable-capacitance element group as the second control signal, a complex change in the output frequency at a time of startup of the power supply can be reduced, thereby allowing the startup characteristic of the output frequency to be stabilized during a time period after startup of the power supply and before a steady state is reached.

According to the present invention, in a crystal-oscillator circuit, a change in the output frequency occurring during a time period after startup of the power supply and before the start of steady oscillation, in which the output frequency is stabilized, can be stabilized.

DETAILED DESCRIPTION

First Embodiment

Figure 1:
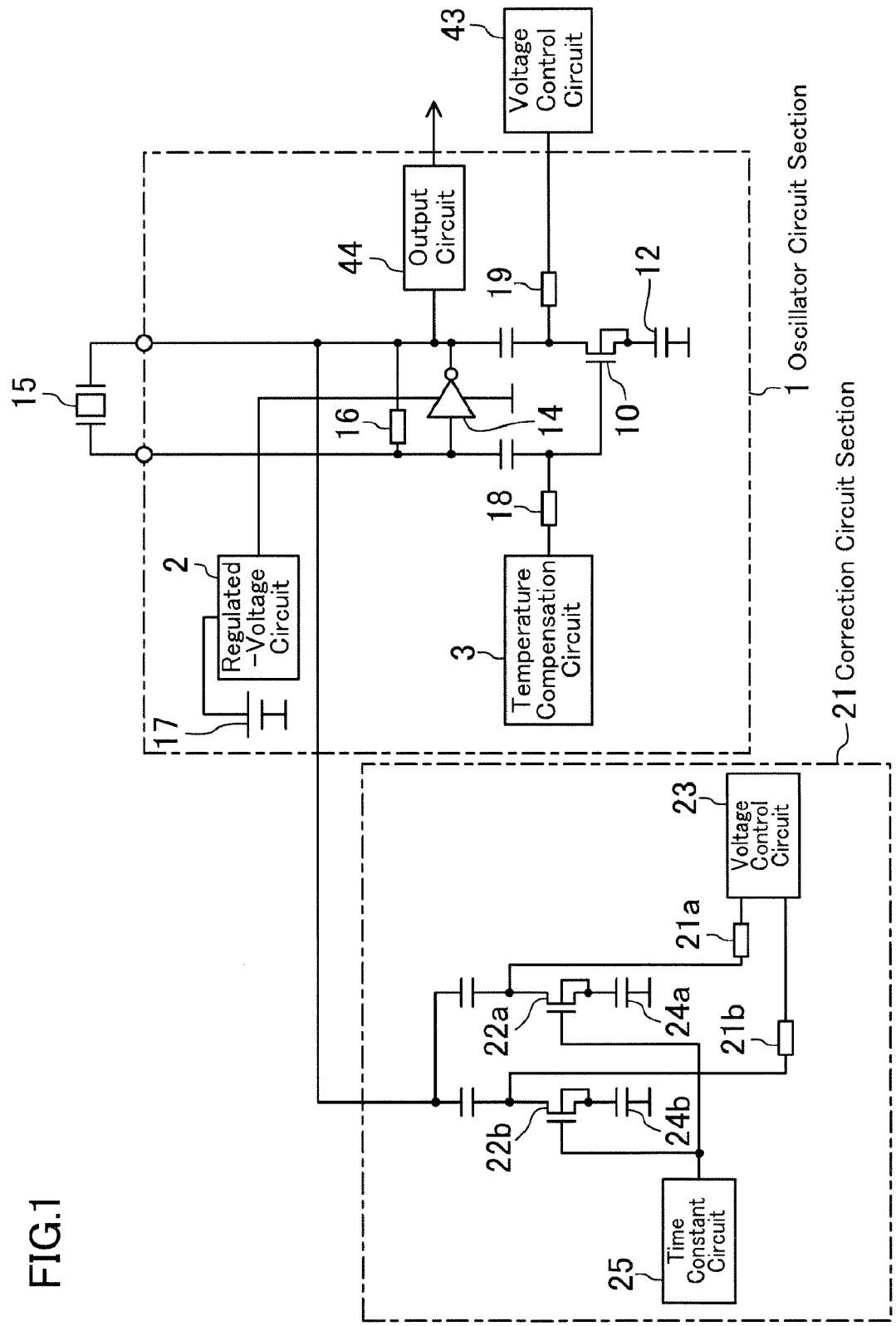
FIG. 1 is a circuit diagram illustrating a configuration of a crystal-oscillator circuit according to the first embodiment.

FIG. 1 is a circuit diagram illustrating a configuration of a crystal-oscillator circuit according to the first embodiment. The crystal-oscillator circuit shown in FIG. 1 includes a quartz crystal unit 15, an oscillator circuit section 1, and a correction circuit section 21. A regulated-voltage circuit 2 is supplied with a supply voltage 17, and supplies a regulated voltage to the oscillator circuit section 1.

In the oscillator circuit section 1, the input and the output of an inverter 14 are connected to the respective ends of the quartz crystal unit 15. A resistor 16 is connected between the input and the output of the inverter 14. The input of the inverter 14 is coupled to the gate of a MOS variable-capacitance element 10, and the output of the inverter 14 is coupled to the drain of the MOS variable-capacitance element 10. The source of the MOS variable-capacitance element 10 is grounded through a fixed-capacitance element 12. In addition, the gate of the MOS variable-capacitance element 10 is coupled to a temperature compensation circuit 3 through a resistor 18, and the drain of the MOS variable-capacitance element 10 is coupled to a voltage control circuit 43 through a resistor 19. The quartz crystal unit 15, the MOS variable-capacitance element 10, which serves as a first variable-capacitance element, and the fixed-capacitance element 12 form an oscillation loop, and an oscillation signal is output from an output circuit 44.

When a supply voltage 17 is applied, a predetermined supply voltage is supplied from the regulated-voltage circuit 2 to the oscillator circuit section 1. Application of the supply voltage to the oscillator circuit section 1 has an impact on the quartz crystal unit 15, thereby causing the crystal-oscillator circuit to start oscillating. A control voltage applied from the voltage control circuit 43 to the drain of the MOS variable-capacitance element 10 causes the capacitance value of the MOS variable-capacitance element 10, and thus the load capacitance of the oscillator circuit section 1, to be adjusted. That is, the voltage control circuit 43 can serve to adjust the oscillation frequency. In addition, a control voltage applied from the temperature compensation circuit 3 to the gate of the MOS variable-capacitance element 10 causes the capacitance value of the MOS variable-capacitance element 10, and thus the load capacitance of the oscillator circuit section 1, to be adjusted. The temperature compensation circuit 3 outputs a control voltage having a temperature characteristic for compensating for the temperature characteristic of the quartz crystal unit 15. That is, the temperature compensation circuit 3 serves to compensate for the temperature characteristic of the quartz crystal unit 15.

In the correction circuit section 21, MOS variable-capacitance elements 22a and 22b, which serve as second variable-capacitance elements, have drains coupled to the output of the inverter 14 in the oscillator circuit section 1, and sources grounded through fixed-capacitance elements 24a and 24b. The gates of the MOS variable-capacitance elements 22a and 22b are coupled to a time constant circuit 25, and the drains of the MOS variable-capacitance elements 22a and 22b are coupled to a voltage control circuit 23 through resistors 21a and 21b. Controlling the drain voltages of the MOS variable-capacitance elements 22a and 22b by the voltage control circuit 23 allows the capacitance values thereof to be changed.

Figure 2:
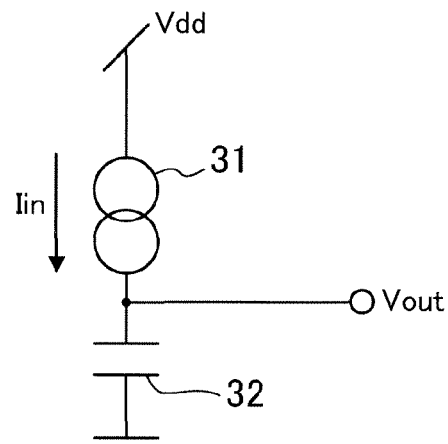
FIG. 2 is a diagram illustrating an example configuration of a time constant circuit.
Figure 3:
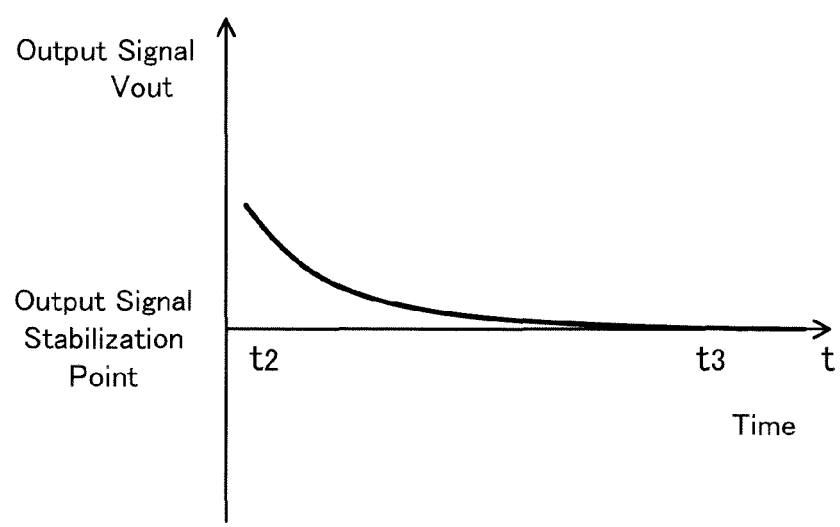
FIG. 3 is a graph showing an output signal characteristic of the time constant circuit.

FIG. 2 illustrates an example configuration of the time constant circuit 25. As shown in FIG. 2, by inputting a constant current Iin output from a constant current source 31 to a capacitive element 32, an output signal (time constant signal) Vout having a characteristic as shown in FIG. 3 is output. Application of the output signal Vout as shown in FIG. 3 to the gates of the MOS variable-capacitance elements 22a and 22b causes an output signal of the correction circuit section 21 to be generated.

Figure 4:
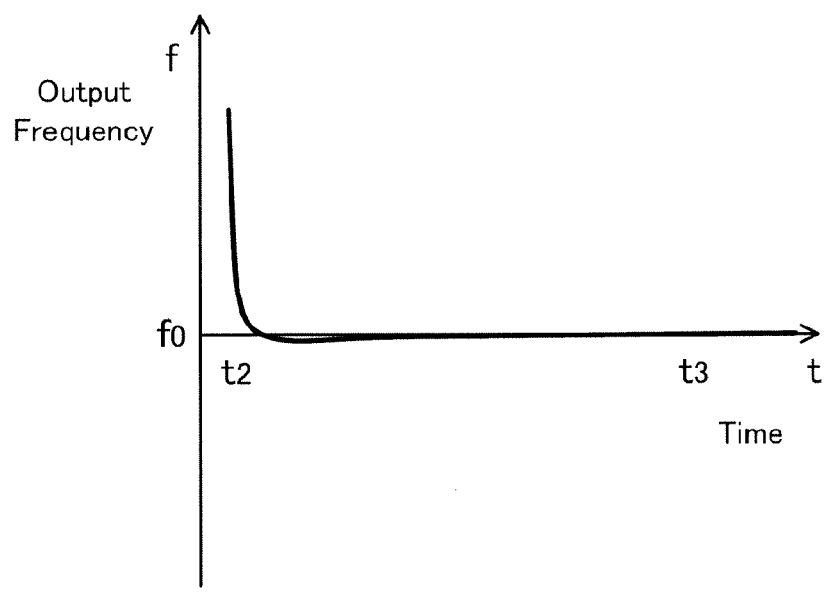
FIG. 4 is a graph showing an output frequency characteristic of the crystal-oscillator circuit according to the first embodiment.

FIG. 4 illustrates an output frequency characteristic of the crystal-oscillator circuit according to this embodiment.

Figure 8:
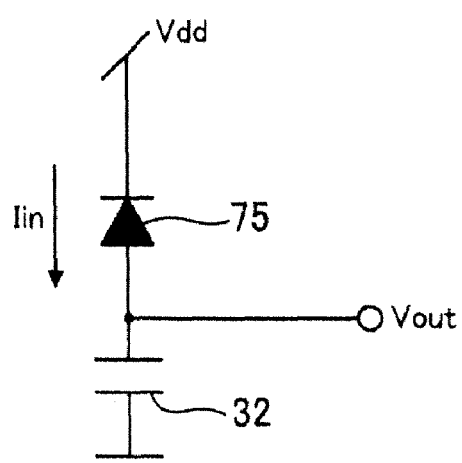
FIG. 8 is a diagram illustrating an example configuration of a time constant circuit.
Figure 9:
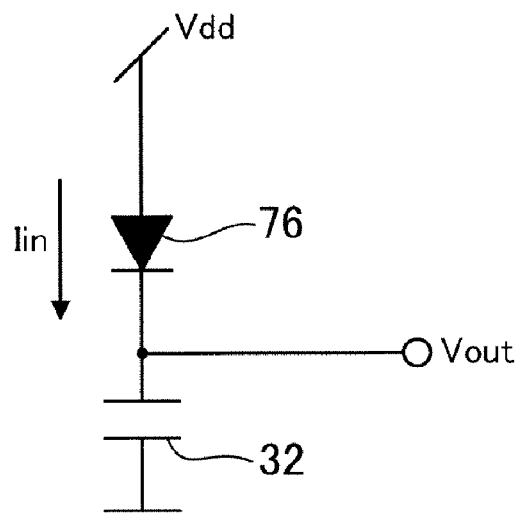
FIG. 9 is a diagram illustrating an example configuration of a time constant circuit.
Figure 10:
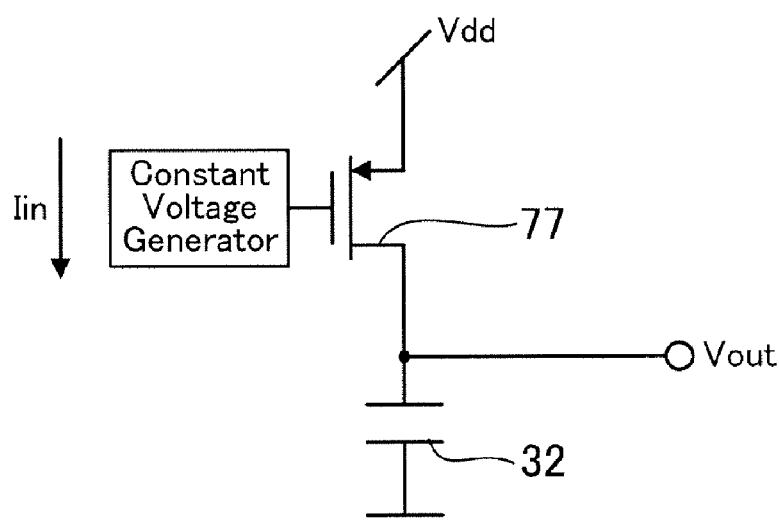
FIG. 10 is a diagram illustrating an example configuration of a time constant circuit.
Figure 11:
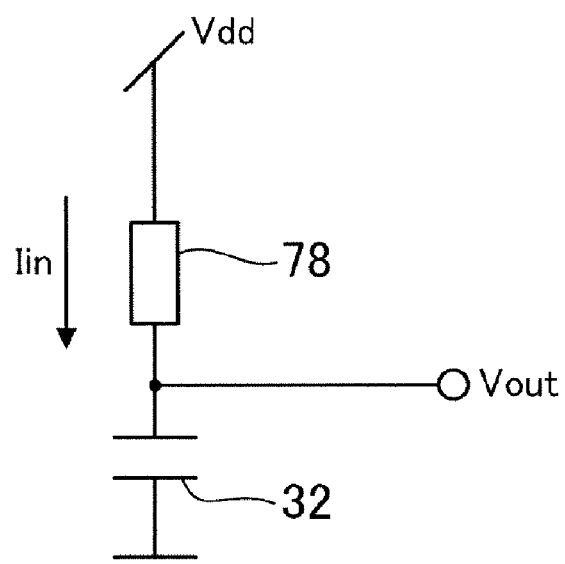
FIG. 11 is a diagram illustrating an example configuration of a time constant circuit.

Note that various configurations may be possible for a time constant circuit. For example, the configuration may be one which uses reverse saturation current of a P-N junction 75 and a capacitive element 32 (FIG. 8), one which uses forward current of a P-N junction 76 and a capacitive element 32 (FIG. 9), one which uses drain-to-source current of a MOS transistor 77 and a capacitive element 32 (FIG. 10), one which uses a resistive element 78 and a capacitive element 32 (FIG. 11), etc.

In the oscillator circuit section 1, a plurality of MOS variable-capacitance elements may be provided.

Second Embodiment

Figure 5:
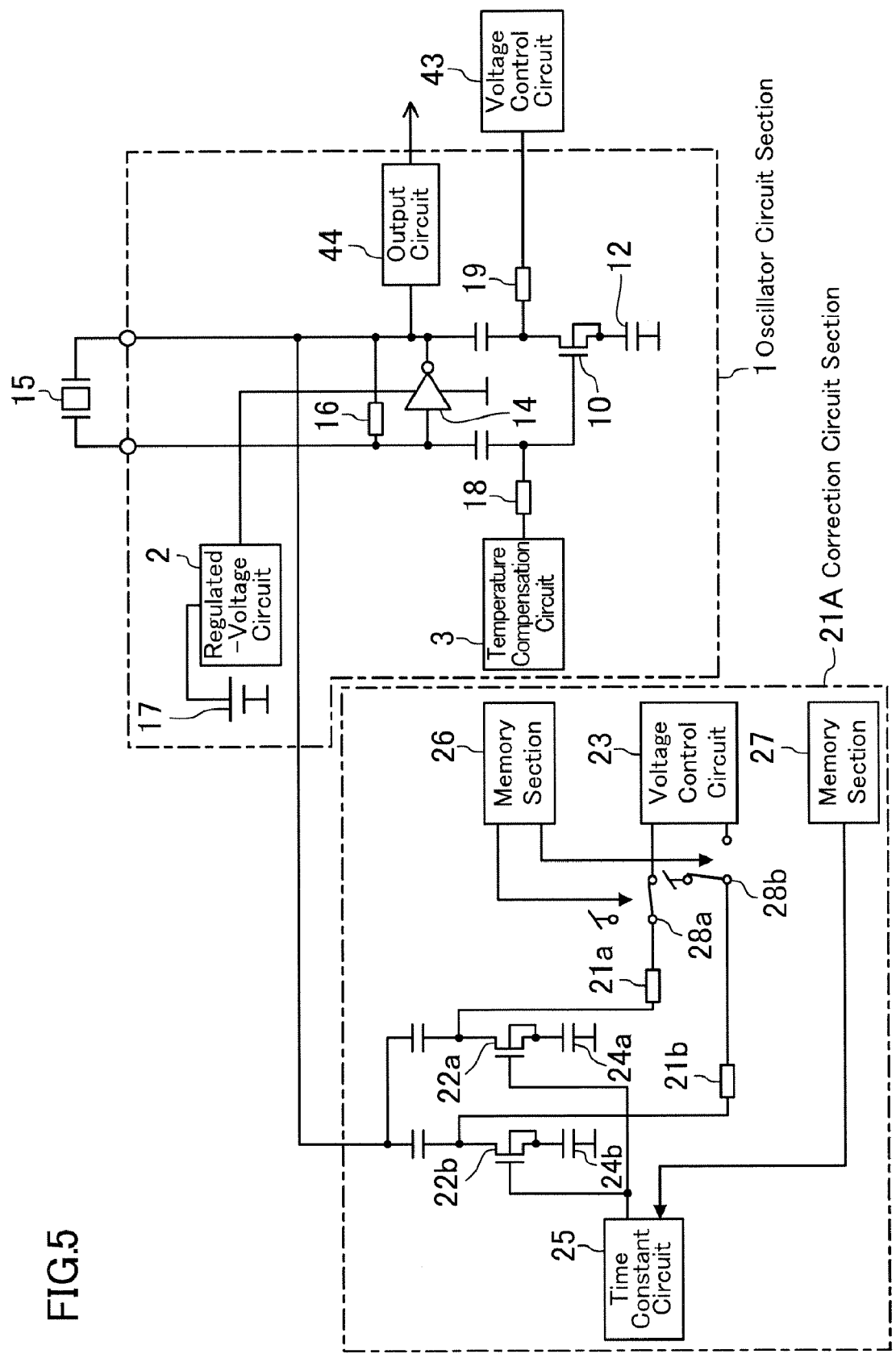
FIG. 5 is a circuit diagram illustrating a configuration of a crystal-oscillator circuit according to the second embodiment.
Figure 6:
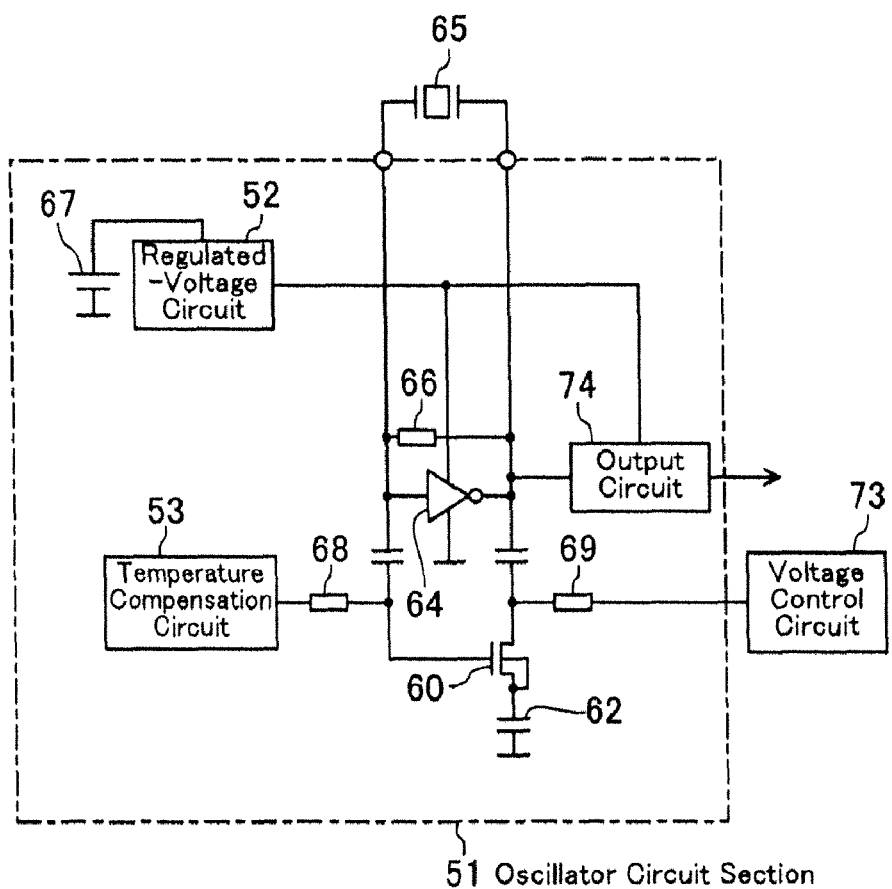
FIG. 6 is a circuit diagram illustrating a configuration of a conventional crystal-oscillator circuit.
Figure 7:
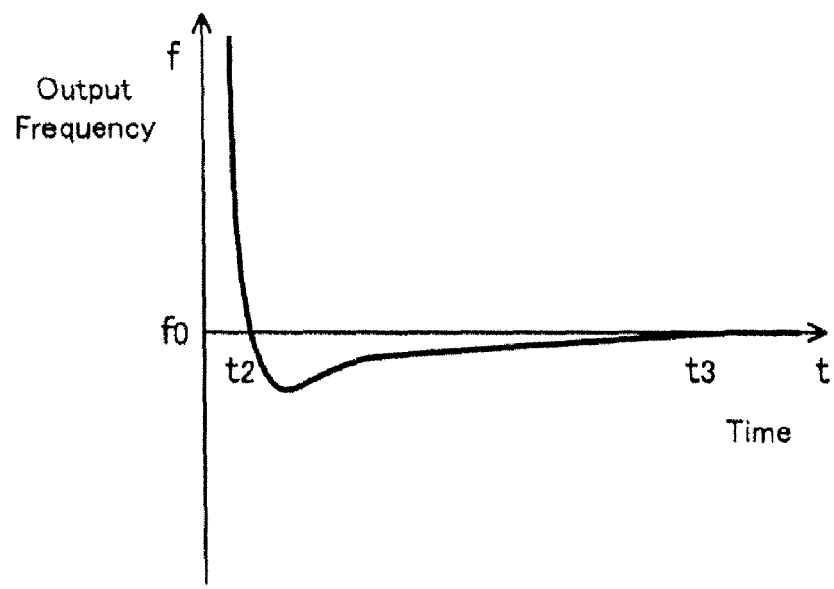
FIG. 7 is a graph showing an output frequency characteristic of a conventional crystal-oscillator circuit.

FIG. 5 is a circuit diagram illustrating a configuration of a crystal-oscillator circuit according to the second embodiment. In FIG. 5, the same reference numerals as those shown in FIG. 1 are used to represent elements equivalent to those shown in FIG. 1, and the detailed explanation thereof will be omitted.

In a correction circuit section 21A, switches 28*a* and 28*b* are respectively provided between the voltage control circuit 23 and the resistors 21*a* and 21*b*. On-off switching of the switches 28*a* and 28*b* is controlled by a memory section 26. A memory section 27 controls the time constant circuit 25, and is capable of adjusting the time constant and the amount of signal change of the output signal.

The configuration of FIG. 5 allows adjustment on a per-module basis. That is, the amount of signal change is adjusted by selecting whether the transistors 22*a* and 22*b* operates or dose not operate by the memory sections 26 and 27. In addition, the time constant is adjusted by selecting the value of the capacitive element 32 in the time constant circuit 25, or by adjusting the saturation point of the current Iin in the time constant circuit 25 by the memory sections 26 and 27. Thus, providing the memory sections 26 and 27 allows the time constant and the amount of signal change of the output signal of the time constant circuit 25 to be adjusted on a per-module basis. Thus, a variation in output frequency change due to each variation of an IC, a quartz crystal unit, and a package included in a module can be adjusted on a per-module basis. In addition, a frequency change can be adjusted depending on the amount of heat generated in the module, which changes according to an output load and a supply voltage level.

Thus, according to each embodiment described above, a change in the output frequency occurring during a time period after startup of the power supply and before the start of steady oscillation, in which the output frequency is stabilized, can be stabilized.

The present invention is advantageous in that a change in the output frequency occurring during a time period after startup of the power supply and before the start of steady oscillation, in which the output frequency is stabilized, can be stabilized, and is useful for, for example, performance improvement of temperature compensated Xtal oscillator (TCXO) modules for mobile phones.

What is claimed is:

1. A crystal-oscillator circuit, comprising:
a quartz crystal unit;
a first variable-capacitance element, connected to the quartz crystal unit so as to form an oscillation loop, and whose capacitance value changes depending on a first control signal;
a temperature compensation circuit configured to provide the first control signal for the first variable-capacitance element to compensate for a temperature characteristic of the quartz crystal unit;
a variable-capacitance element group, connected to the quartz crystal unit, and whose capacitance value changes depending on a second control signal; and
a time constant circuit configured to generate a time constant signal which changes with a predetermined time constant, and to provide the time constant signal for the variable-capacitance element group as the second control signal,
wherein the time constant circuit uses reverse saturation current of a P-N junction and a capacitive element.

2. A crystal-oscillator circuit, comprising:
a quartz crystal unit;
a first variable-capacitance element, connected to the quartz crystal unit so as to form an oscillation loop, and whose capacitance value changes depending on a first control signal;
a temperature compensation circuit configured to provide the first control signal for the first variable-capacitance element to compensate for a temperature characteristic of the quartz crystal unit;
a variable-capacitance element group, connected to the quartz crystal unit, and whose capacitance value changes depending on a second control signal; and
a time constant circuit configured to generate a time constant signal which changes with a predetermined time constant, and to provide the time constant signal for the variable-capacitance element group as the second control signal,
wherein the time constant circuit uses forward current of a P-N junction and a capacitive element.

3. A crystal-oscillator circuit, comprising:
a quartz crystal unit;
a first variable-capacitance element, connected to the quartz crystal unit so as to form an oscillation loop, and whose capacitance value changes depending on a first control signal;
a temperature compensation circuit configured to provide the first control signal for the first variable-capacitance element to compensate for a temperature characteristic of the quartz crystal unit;
a variable-capacitance element group, connected to the quartz crystal unit, and whose capacitance value changes depending on a second control signal;
a time constant circuit configured to generate a time constant signal which changes with a predetermined time constant, and to provide the time constant signal for the variable-capacitance element group as the second control signal; and
a memory section configured to adjust the time constant of the time constant signal output from the time constant circuit.

4. A crystal-oscillator circuit, comprising:
a quartz crystal unit;
a first variable-capacitance element, connected to the quartz crystal unit so as to form an oscillation loop, and whose capacitance value changes depending on a first control signal;
a temperature compensation circuit configured to provide the first control signal for the first variable-capacitance element to compensate for a temperature characteristic of the quartz crystal unit;
a variable-capacitance element group, connected to the quartz crystal unit, and whose capacitance value changes depending on a second control signal;
a time constant circuit configured to generate a time constant signal which changes with a predetermined time constant, and to provide the time constant signal for the variable-capacitance element group as the second control signal; and a memory section configured to adjust the amount of signal change of the time constant signal output from the time constant circuit.

5. The crystal-oscillator circuit of claim 1, further comprising a memory section configured to adjust the time constant of the time constant signal output from the time constant circuit.

6. The crystal-oscillator circuit of claim 2, further comprising a memory section configured to adjust the time constant of the time constant signal output from the time constant circuit.

7. The crystal-oscillator circuit of claim 1, further comprising a memory section configured to adjust the amount of signal change of the time constant signal output from the time constant circuit.

8. The crystal-oscillator circuit of claim 2, further comprising a memory section configured to adjust the amount of signal change of the time constant signal output from the time constant circuit.

* * * * *

UNITED STATES PATENT AND TRADEMARK OFFICE
CERTIFICATE OF CORRECTION

PATENT NO. : 8,228,131 B2  Page 1 of 1
APPLICATION NO. : 13/005176
DATED : July 24, 2012
INVENTOR(S) : Kei Nagatomo et al.

It is certified that error appears in the above-identified patent and that said Letters Patent is hereby corrected as shown below:

On the Title Page, Item (56) References Cited should read,

~~6~~ 5,977,840 B2

Signed and Sealed this
Nineteenth Day of February, 2013

Teresa Stanek Rea
*Acting Director of the United States Patent and Trademark Office*